April 24, 1951 B. M. CHARCHIAN ET AL 2,549,775

OSCILLATOR CIRCUIT RESPONSIVE TO HALL EFFECT

Filed March 8, 1947

*INVENTORS*
BENJAMIN MALCOLM CHARCHIAN
ANTONIO RAMON VALLARINO
BY R P Morris
ATTORNEY Patented Apr. 24, 1951 2,549,775

UNITED STATES PATENT OFFICE 2,549,775

OSCILLATOR CIRCUIT RESPONSIVE TO HALL EFFECT

Benjamin Malcolm Charchian and Antonio Ramon Valiarino, New York, N. Y., assignors to International Standard Electric Corp., New York, N. Y., a corporation of Delaware Application March 8, 1947, Serial No. 733,318

7 Claims. (Cl. 332—29)

Figure 1:
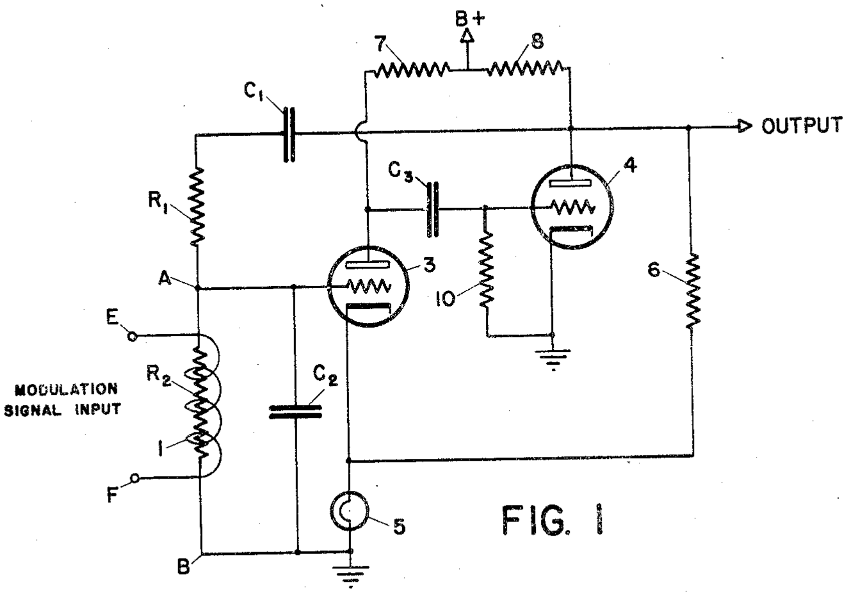

This invention relates to circuit arrangements for obtaining frequency modulation of a carrier wave. More particularly it is concerned with the application of a novel form of signal translating device to a frequency modulator.

In carrying out our invention we have discovered that certain resistive materials which exhibit the so-called "Hall effect" to a marked degree are well suited to the requirements of a frequency modulator, and may be supplied as a predetermined component of a modulator circuit in such a way as to obtain very considerable operational advantages.

By "Hall effect" we refer to the influence which can be produced upon the ohmic value of a certain resistor composed of a suitably chosen metal or alloy, the resistor being immersed in a variable magnetic field. Bismuth and tellurium are two metals which have a remarkably high "Hall effect." Other materials are known to exhibit this "Hall effect" in a less pronounced degree.

Accordingly, it is an object of our invention to provide a circuit arrangement for obtaining frequency modulation effects when the modulation energy is translated into variations of magnetic field intensity and a resistor of suitably chosen material is subjected to the field intensity variations for varying its ohmic value.

Another object is to provide means for controlling the frequency of an oscillation generator in accordance with variations of resistance which are produced in a resistive element of suitable substance by virtue of its immersion in a variable magnetic field.

Still another object is to provide a modulator in association with an oscillation generator, the modulator being operative to translate a modulation wave into variations in the ohmic value of a resistor, these variations being then utilized to vary the frequency of a carrier wave generator.

Our invention aims to avoid certain drawbacks which have been observed in the operation of systems of the prior art. For example, in the design of circuits for conversion of the form of modulation energy, bridge networks have oftentimes been utilized. Modulation energy fed through such networks and applied to a carrier wave generator for purposes of frequency modulation is not easily so applied without the accompaniment of adverse influences upon the generator. Extreme care must be taken to maintain the stability and constant amplitude of the oscillations generated.

We have found that by introducing a resistor of suitably chosen material into the circuit of an oscillation generator, the material being one which exhibits markedly the Hall effect, and by causing the ohmic value of this resistor to be varied in accordance with the field intensity of the space occupied by the resistor, the field intensity variations may be directly controlled from a given modulation source and the frequency of the oscillation generator may be correspondingly controlled.

In one preferred circuit arrangement the above mentioned resistor is composed of bismuth or tellurium and may be disposed in one of the control grid circuits of an oscillation generator. It may alternatively be coupled to the control grid circuit through a transformer. In either case it is surrounded by a wire helix or solenoid which is connected to the modulation source the signals from which are to be used for modulating the generator.

Figure 2:
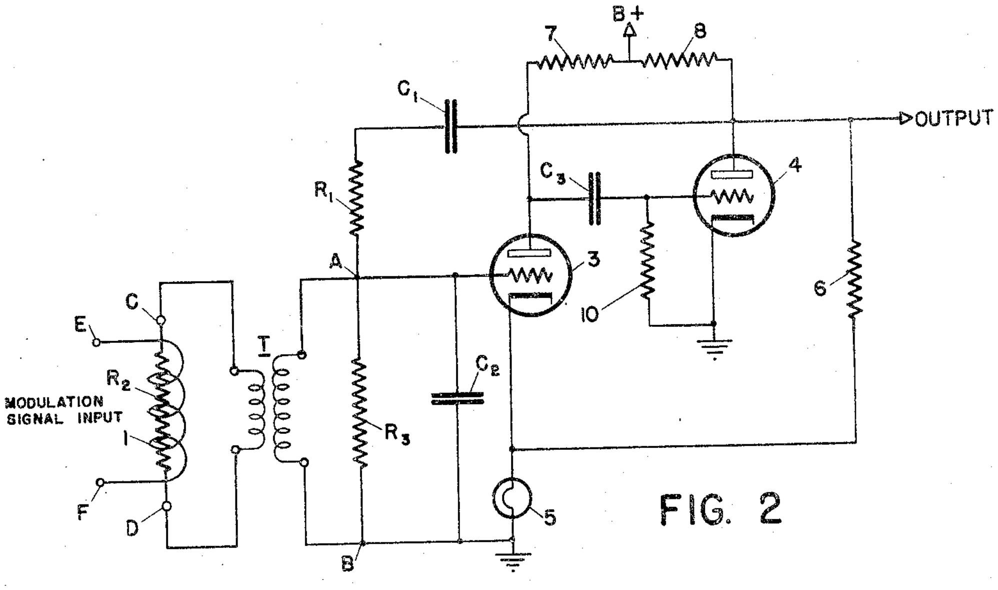

Our invention will now be described in more detail, reference being made to the accompanying drawing, in which, Fig. 1 shows diagrammatically a preferred circuit arrangement for carrying out the invention, and Fig. 2 shows a modification which illustrates a convenient transformer coupling method by which the modulations are applied for varying the frequency of an oscillator.

Referring first to Fig. 1 we show therein a solenoid 1, the terminals of which are designated E and F respectively. Modulation signal energy of any type, whether audio, video, or code, is applied to the terminals E and F. Within the convolutions of the solenoid we mount a special resistor $R_2$, the terminals of which are designated A and B respectively. The substance of this resistor is chosen from a group of materials which include bismuth and tellurium and possibly other metals or alloys thereof.

The resistor $R_2$ is in circuit between the control grid of a discharge tube 3 and ground. A capacitor $C_2$ is connected in parallel with resistor $R_2$. These two components $R_2$ and $C_2$ constitute a section of a feed-back circuit, as will presently be explained in more detail.

The discharge tube 3 and another tube 4 are both included in an oscillation generator circuit which is preferably of the resistance-capacity type, a so-called RC-oscillator. Anode potential is supplied to the anodes in tubes 3 and 4 through resistors 7 and 8 respectively. This potential is derived from the positive terminal B+ of a direct current source (not shown), the negative terminal of this source being grounded.

The anode of tube 3 is coupled to the control grid of tube 4 through a capacitor $C_3$. Feed-back potentials for sustaining the oscillations traverse two serially connected sections of a time constant circuit which possesses a phase-shifting function. The first section comprises a capacitor $C_1$ in series with a resistor $R_1$, this section being connected between the anode of tube 4 and the control grid of tube 3. The second section comprises the aforementioned special resistor $R_2$ in parallel with a capacitor $C_2$, this section being connected between the control grid of tube 3 and ground.

The cathode of tube 3 is connected to ground through a resistor 5 which preferably possesses a suitable temperature coefficient for aiding in the stabilization of the oscillations generated. Resistor 5 is preferably constituted as the filament of an incandescent lamp.

A negative feed-back circuit also contributes toward stabilization and is constituted as a direct connection through a resistor 6 between the anode of tube 4 and the cathode of tube 2.

As shown in Fig. 1, the arrangement of two tubes 3 and 4 and their circuit components is one which is substantially in accordance with the teachings of Hewlett-Packard. This circuit arrangement has been chosen for purposes of illustration only, since other well known forms of generators may be substituted if desired. In place of the triode tubes 3 and 4 multigrid tubes may be used if desired.

In the operation of our invention, particularly as embodied in the circuit arrangement shown in Fig. 1, audio-frequency waves or other signals are passed through the coil of the solenoid 1 and produce corresponding changes in the magnetic field within the convolutions of the coil. This field is occupied by the resistor $R_2$ which is composed of tellurium, bismuth or other metal exhibiting the Hall effect. Variations in the strength of the magnetic field therefore produce variations in the resistance of the element $R_2$ with the result that the phase of the feed-back potential as applied to the grid in tube 3 is varied and the frequency of the generated oscillations is correspondingly modulated.

Another way to explain the frequency modulation effects is that when the value of the resistor $R_2$ is altered by variations in the magnetic field intensity there is a corresponding variation in the value of the time constant circuit section which includes resistor $R_2$ in parallel with capacitor $C_2$. Now the time constant circuit section which includes capacitor $C_1$ in series with resistor $R_1$ is connected in series with the circuit $R_2C_2$ so that any change in the value of one section produces a corresponding change in the amount of phase shift of the feed-back potential as applied to the grid of tube 3. It may be readily understood, therefore, that these changes produce frequency shifts in the output from the oscillator which are in substantial accord with the modulation potentials applied to the input terminals E—F.

Attention is particularly called to the fact that this method of frequency modulation is one which is substantially free from the adverse influence of potential variations in the grid biasing circuits. The modulation potentials are translated into variations of resistance of the element $R_2$ and this resistance is traversed only by the feed-back potentials which do not appreciably vary in amplitude. This advantageous condition makes for greatly improved performance, especially as to the avoidance of amplitude distortion.

Referring now to Fig. 2 we show therein a modification of our invention wherein the modulation potentials are applied at input terminals E and F, across which the winding of the solenoid 1 is connected. In this case the special resistor $R_2$ within the convolutions of the solenoid 1 is connected to terminals C and D which are also the terminals of the primary winding of a transformer T. The secondary winding of this transformer is connected across the terminals A and B which are included in the second section of the time constant circuit as described above in reference to the oscillation generator circuit arrangement of Fig. 1.

The oscillation generator circuit of Fig. 2 will be seen to correspond in all respects to that of Fig. 1 with the exception that since resistor $R_2$ is now removed from the generator circuit proper, an additional resistor $R_3$ must be provided in parallel with capacitor $C_2$.

Components of the circuit arrangement in Fig. 2 which correspond to those of Fig. 1 are given like reference characters and need not, therefore, be described in more detail at this point. The distinguishing features will, however, be explained.

One of the secondary terminals of transformer T is directly connected to junction point A between the two sections of the time constant circuit. The control grid of tube 3 is also connected to junction point A. The other secondary terminal of transformer T may, under certain conditions, be directly connected to junction point B, which is grounded. Preferably, however, this connection is made through a capacitor $C_4$. By this arrangement a path of low impedance to alternating currents is provided through the transformer secondary, while a path of relatively high impedance to D. C. potentials is maintained through resistor $R_3$ for producing a satisfactory bias on the grid of tube 3.

Alternating potentials traverse the secondary winding of transformer T, these being derived from the feedback energy which originates with anode potential variations in tube 4. Transformer T serves as a variable reactance in controlling the frequency of the oscillator. This is due to the fact that a portion of the feed-back energy is fed to the resistor $R_2$, the ohmic value of which is controlled by the signal input potentials.

The prime purpose of adding the transformer T to the simpler circuit of Fig. 1 is to permit the use of a resistive element $R_2$ having a very low resistance value. It has been observed that either of the metals bismuth or tellurium is so subject to pulverization that it is difficult to produce a permanently dependable wire resistor of relatively high ohmic value. Therefore, as a matter of convenience in forming a resistor of bismuth or tellurium which will exhibit the Hall effect and which will at the same time be controllable by modulation potentials through the medium of a controlled electromagnetic field, a very low resistance value is chosen for the element $R_2$. The normal resistance value of the resistor $R_2$ is matched by a corresponding resistance value chosen for the primary winding of the transformer T. This arrangement provides advantageous conditions for step-up transformation of the modulation energy so that effectively the ohmic value of the time constant circuit comprising the secondary winding of transformer T in parallel with the capacitor $C_2$ will operate to produce the desired range of phase-shift in the feed-back circuit of the oscillator. Thus, small variations in the ohmic value of resistor $R_2$ as produced by the signal input potentials will have a very appreciable effect upon the control of the frequency of the oscillation generator.

In other respects the operation of the circuit arrangement shown in Fig. 2 will be readily understood in view of the more detailed description of Fig. 1 as hereinabove given.

We wish it to be understood that in carrying out our invention we are in no wise limited to the use of an oscillation generator of the particular type which has been shown and described, this type having been chosen merely because it is representative, is well known, and is well suited to our requirements. Other modifications of the invention may also be made by those skilled in the art without departing from the spirit and scope of our invention.

We claim:

1. A modulator system for an oscillation generator comprising a frequency control circuit coupled to the input circuit of said generator, said control circuit including an element of resistance material the ohmic value of which is sensitive to variations in the magnetic field density of the space which said resistor occupies, and a solenoid surrounding said resistor and connected in circuit with a source of modulating potentials, said solenoid constituting means for controlling said magnetic field density, said resistor being composed of a metal selected from the class consisting of bismuth, tellurium and alloys thereof.

2. In a frequency modulating system which includes signal input terminals across which a solenoid is connected, and includes further a resistor comprising material whose resistance varies in accordance with the intensity of an incident magnetic field, the method of controlling the frequency of a resistance-capacitance controlled oscillator which comprises subjecting said resistor to the influence of a variable magnetic field produced by said solenoid, and causing the resultant ohmic value variations of said resistor to control the amount of phase-shift of feed-back potentials in said oscillator.

3. Apparatus for frequency-modulating a radiant energy wave, comprising an oscillation generator having a control circuit which includes the secondary of a transformer, a closed circuit including a resistor and the primary of said transformer, said resistor being composed of bismuth, means including a solenoid surrounding said resistor for controlling its ohmic value, and means including a source of modulation energy connected to said solenoid for varying the magnetic field density within the body of said resistor thereby to produce variations in the reactance of said closed circuit.

4. Apparatus for frequency-modulating a radiant energy wave, comprising an oscillation generator having a control circuit which includes the secondary of a transformer, a closed circuit including a resistor and the primary of said transformer, said resistor being composed of tellurium, means including a solenoid surrounding said resistor for controlling its ohmic value, means including a source of modulation energy connected to said solenoid for varying the magnetic field density within the body of said resistor thereby to produce variations in the overall resistance of said closed circuit, and circuit components in said generator arranged and adapted to respond to said resistance variations.

5. An electrical energy translating system comprising a solenoid, a resistive element composed of bismuth and mounted within the convolutions of the solenoid, and a closed circuit including said resistive element and the primary winding of an output transformer, said solenoid being connected to a signaling source and being operative to variably control the ohmic value of said resistive element.

6. An electrical energy translating system comprising a solenoid, a resistive element composed of tellurium and mounted within the convolutions of the solenoid, and a closed circuit including said resistive element and the primary winding of an output transformer, said solenoid being connected to a signaling source and being operative to variably control the ohmic value of said resistive element.

7. In a modulation system for an oscillation generator, an oscillation generator the output from which is to be frequency-modulated, an input circuit for said generator containing the secondary winding of a transformer, a modulation feeder circuit including the primary winding of said transformer and a resistor composed of a material selected from the class which is capable of exhibiting resistance variations in accordance with the intensity of an incident magnetic field, said resistor comprising a metal selected from the class consisting of bismuth and tellurium.

BENJAMIN MALCOLM CHARCHIAN.
ANTONIO RAMON VALLARINO.

REFERENCES CITED

The following references are of record in the file of this patent:

UNITED STATES PATENTS

| Number | Name | Date |
|---|---|---|
| 1,778,796 | Craig | Oct. 21, 1930 |
| 1,841,459 | Taylor | Jan. 19, 1932 |
| 2,085,739 | Crosby | July 6, 1937 |
| 2,321,269 | Artzt | June 8, 1943 |
| 2,346,396 | Rider | Apr. 11, 1944 |
| 2,418,842 | Kinsburg | Apr. 15, 1947 |